(12) United States Patent
Franke

(10) Patent No.: US 7,888,952 B2
(45) Date of Patent: Feb. 15, 2011

(54) CIRCUIT ARRANGEMENT FOR BALANCING A RESISTANCE CIRCUIT

(75) Inventor: Reiner Franke, Velbert (DE)

(73) Assignee: Atmel Automotive GmbH, Duisburg (DE)

( * ) Notice: Subject to any disclaimer, the term of this patent is extended or adjusted under 35 U.S.C. 154(b) by 82 days.

(21) Appl. No.: 12/272,240

(22) Filed: Nov. 17, 2008

(65) Prior Publication Data

US 2009/0153179 A1 Jun. 18, 2009

Related U.S. Application Data

(60) Provisional application No. 61/014,420, filed on Dec. 17, 2007.

(30) Foreign Application Priority Data

Nov. 16, 2007 (DE) .................. 10 2007 055 104

(51) Int. Cl.
*G01R 31/26* (2006.01)
(52) U.S. Cl. ................................. 324/750.16
(58) Field of Classification Search ........... None
See application file for complete search history.

(56) References Cited

U.S. PATENT DOCUMENTS

| 4,929,993 | A | 5/1990 | Popovic |
| 6,222,355 | B1 * | 4/2001 | Ohshima et al. ............ 323/282 |
| 2009/0121667 | A1 * | 5/2009 | Zametzky ................... 318/434 |

FOREIGN PATENT DOCUMENTS

| EP | 0 204 135 A1 | 12/1986 |
| EP | 0 971 279 A1 | 1/2000 |

* cited by examiner

*Primary Examiner*—Jermele M Hollington
(74) *Attorney, Agent, or Firm*—Muncy, Geissler, Olds & Lowe, PLLC

(57) ABSTRACT

A circuit arrangement is provided for balancing a resistance circuit, which has a field-effect transistor as a controllable resistor and a control circuit, by which the field-effect transistor can be controlled with a gate-source voltage so that there is a resistance between a drain electrode and a source electrode of the field-effect transistor in a predefinable ratio to a reference resistor. In a balancing operation mode, a reference current can be set by the drain-source path of the field-effect transistor and by the reference resistor, which depends on a differential voltage between a voltage drop, caused by the reference current at the reference resistor and a voltage drop, caused by the reference current, at the drain-source path of the field-effect transistor.

11 Claims, 1 Drawing Sheet

CIRCUIT ARRANGEMENT FOR BALANCING A RESISTANCE CIRCUIT

This nonprovisional application claims priority to German Patent Application No. DE 102007055104.7, which was filed in Germany on Nov. 16, 2007, and to U.S. Provisional Application No. 61/014,420, which was filed on Dec. 17, 2007, and which are both herein incorporated by reference.

BACKGROUND OF THE INVENTION

1. Field of the Invention

The invention relates to a circuit arrangement.

2. Description of the Background Art

A circuit arrangement is made, for example, with a bridge configuration shown in FIG. 1. Circuit arrangements of this type cause an adjustment of the gate-source voltage of the Field-effect transistor M in such a way that the same voltage drop occurs across the drain-source path as across the reference resistor R.

Balancing circuits of the type shown in FIG. 1 are operated in a relatively small operating point, i.e., at low drain-source voltage drops, as occur also during normal MOS resistor operation outside balancing, for example, during use as a controllable resistor in a digital-to-analog converter.

A possible way to reduce the aforementioned balancing error is to select a relatively large operating point, i.e., higher drain-source voltage drops during balancing, so that the relative part of the offset voltage causing the balancing error becomes smaller. As a result, the balancing becomes more precise.

The ratio of the resistance value of the MOS resistor to the reference resistor depends on the manufacturing process selected for the fabrication of the MOS resistor, on the temperature, and on other parameters, which is why the balancing result cannot be applied in a simple way to the small operating point used for normal operation.

SUMMARY OF THE INVENTION

It is therefore an object of the present invention to provide a circuit arrangement which can be balanced as precisely as possible.

Accordingly, in a balancing operation mode, a reference current can be set by the drain-source path of the field-effect transistor and by the reference resistor, which depends on a differential voltage between a voltage drop, caused by the reference current, at the reference resistor and a voltage drop, caused by the reference current, at the drain-source path of the field-effect transistor.

In contrast to balancing circuits according to FIG. 1, which provide a constant reference current through the reference resistor and also through the drain-source path of the field-effect transistor, the present invention enables the use of an inconstant, especially selected reference current for the balancing. This inconstant, special reference current is impressed according to the invention on both the reference resistor and the MOS resistor to be balanced, whereas the current through the reference resistor is always selected as constant according to FIG. 1.

The reference current of the invention through both circuit branches exhibits a dependence on the control signal of the balancing process, i.e., the differential voltage of the bridge amplifier AMP, which in turn is technology-dependent like the MOS resistor operating parameters. This advantageously has the result that the MOS resistor in the selection of the reference current according to the invention is always balanced in such a way that a technology-independent balancing results.

The selection of the reference current according to the invention therefore enables the setting of an operating point of the MOS resistor, which leads to a technology-independent ratio of the resistance value of the MOS resistor to the reference resistor.

In an embodiment of the invention, a controllable current source such as, e.g., a field-effect transistor is provided, which generates a balancing current as a function of the differential voltage in a balancing branch.

In another embodiment of the invention, a current mirror circuit is provided by means of which the reference current can be generated depending on the balancing current or differential voltage.

The circuit arrangement of the invention is particularly suitable for use in digital-to-analog converter circuits, which have at least one field-effect transistor as a controllable resistor, which is in particular a component of a resistance network. The field-effect transistor, in this case, can also be connected in a turned-off state, in which the drain-source path of the field-effect transistor is very high-impedance. To realize a balancing of the field-effect transistor with a reference transistor, the field-effect transistor to be balanced can be connected, e.g., temporarily to the circuit arrangement of the invention, or a separate, identically built field-effect transistor can be provided, which is permanently connected to the balancing circuit of the invention, and which provides a control voltage corresponding to the balanced state for the field-effect transistor to be balanced.

Additional features, applications, and advantages of the invention emerge from the following description of exemplary embodiments of the invention, which are shown in the figures of the drawing. Here, all described or depicted features alone or in any combination form the subject of the invention, irrespective of their summarization in the claims or their dependencies, as well as irrespective of their wording or depiction in the description or in the drawing.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 2:
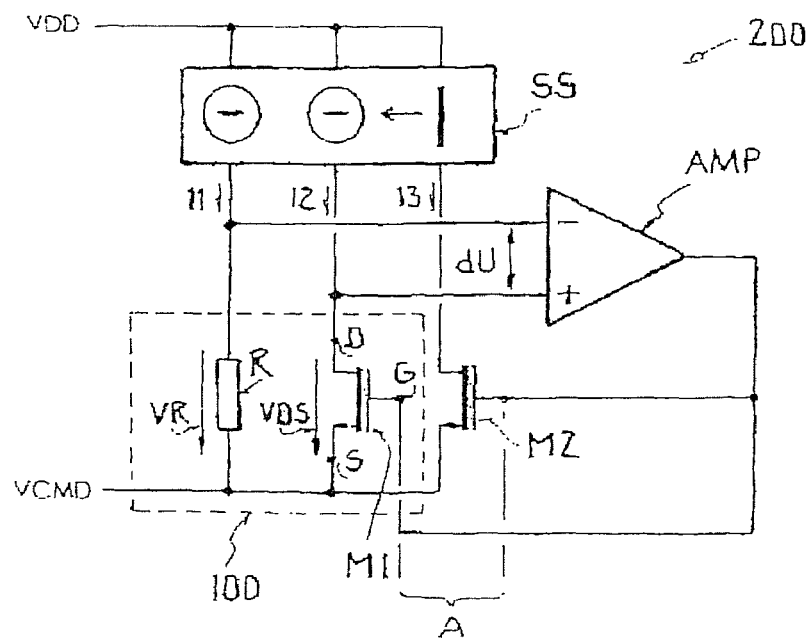
FIG. 2 shows an embodiment of the balancing circuit of the invention.

FIG. 2 shows a circuit arrangement 200, according to an embodiment of the invention for balancing a resistance circuit 100, which has a reference resistor R made as an ohmic resistor and a field-effect transistor M1 as a controllable resistor, as a so-called MOS resistor.

The balancing process of the invention has the goal of making the resistance value of the MOS resistor M1 agree with that of the reference resistor R.

Figure 1:
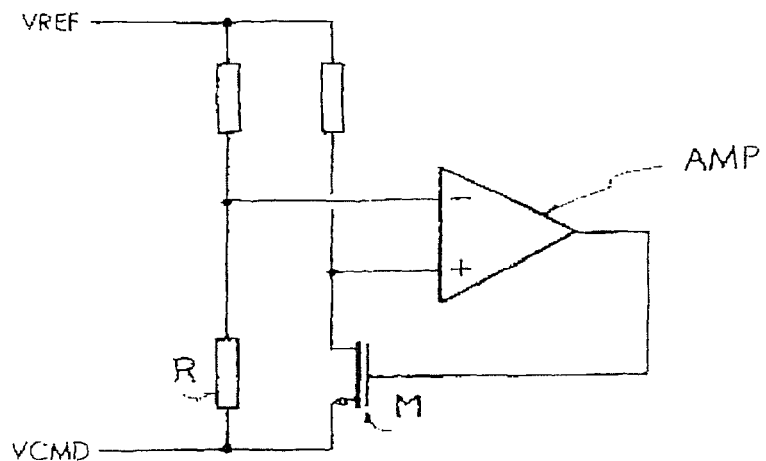
FIG. 1 shows a conventional balancing circuit in a bridge configuration.

To this end, it is provided according to the invention that, in contrast to the prior art according to FIG. 1, both the MOS resistor M1 and reference resistor R are supplied with a suitable reference current I1, I2, which is a function of the differential voltage dU at the input of the differential amplifier AMP and in particular is not constant.

As a result, for the balancing according to the invention, such an operating point of the MOS resistor M1 can be set flexible in each case, which according to tests performed by the applicant leads to a technology-independent ratio of the respective resistance value of the MOS resistor M1 to the reference resistor R, so that with use of balancing circuit 200 of the invention a more precise balancing, particularly also between such components R and M1, is enabled, which has been obtained with the use of different fabrication processes and, therefore, e.g., with different temperature dependencies, etc.

According to FIG. 2, a balancing branch A is provided, which has an additional field-effect transistor M2. The additional field-effect transistor M2 acts as a voltage-controlled current source to generate a balancing current I3 of the invention from the voltage difference dU amplified by differential amplifier AMP.

As is evident from FIG. 2, the voltage difference dU results from a difference between a voltage drop VR caused by reference current I1 at reference resistor R and a voltage drop VDS caused by reference current I2 at the drain-source path of field-effect transistor M1.

Reference current I1 for the balancing operation of reference resistor R is formed, depending on balancing current I3, by current mirror SS, on the one hand. On the other hand, reference current I2 for the balancing operation of MOS resistor M1 is also formed by current mirror SS.

Both reference currents I1, I2 are identical in a preferred variant of the invention.

Based on the above-described determination of reference current I3 or reference currents I1, I2, for the balancing according to the invention, such an operating point of MOS resistor M1 is advantageously set flexible in each case, which leads to a technology-independent ratio of the respective resistance value of MOS resistor M1 to reference resistor R, so that with use of balancing circuit 200 of the invention a more precise balancing, particularly also between such components R and M1 is enabled, which has been obtained with the use of different fabrication processes and therefore, e.g., with different temperature dependencies, etc.

The gate-source voltage of MOS resistor M1, arising during the above-described balancing process, can be supplied advantageously to other MOS transistors, so that these assume a resistance value comparable to reference resistor R.

Circuit arrangement 200 of the invention is particularly suitable for use in digital-to-analog converter circuits, which have at least one field-effect transistor as a controllable resistor, which is in particular a component of a resistance network. To realize the balancing of the field-effect transistor with a reference resistor, the field-effect transistor to be balanced, e.g., can be temporarily connected to circuit arrangement 200 of the invention, or a separate, identically built field-effect transistor M1 can be provided, which is permanently connected to balancing circuit 200 of the invention, and which provides a control voltage corresponding to the balanced state to the field-effect transistor to be balanced.

Because of the technology independence of the balancing of the invention, a relatively large operating point of MOS resistor M1 can also be advantageously selected, so that the relative portion of the offset voltage, causing a balancing error, of differential amplifier AMP becomes smaller.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit arrangement for balancing a resistance circuit, said resistance circuit including a field-effect transistor as a controllable resistor and a reference resistor, said circuit arrangement comprising:
   a control circuit configured to control the field-effect transistor by a gate-source voltage such that a resistance between a drain electrode and a source electrode of the field-effect transistor is in a predefinable ratio to said reference resistor, said control circuit including a balancing operation circuit, providing a first reference current to the reference resistor and providing a second reference current to the drain-source path of the field-effect transistor, wherein said first and second reference currents function to provide a differential voltage between a first voltage drop caused by the first reference current at the reference resistor and a second voltage drop caused by the second reference current at the drain-source path of the field-effect transistor.

2. The circuit arrangement according to claim 1, said balancing operation circuit comprising a controllable current source, which generates a balancing current as a function of the differential voltage in a balancing branch of the balancing operation circuit.

3. The circuit arrangement according to claim 2, further comprising a current mirror circuit, via which the first and second reference currents are generated depending on the balancing current or the differential voltage.

4. An electronic circuit comprising:
   at least one field-effect transistor functioning as a controllable resistor, which is a component of a resistance circuit; and
   at least one circuit arrangement for balancing the resistance circuit said circuit arrangement including; a control circuit configured to control the field-effect transistor by a gate-source voltage such that a resistance between a drain electrode and a source electrode of the field-effect transistor is in a predefinable ratio to said reference resistor, said control circuit including a balancing operation circuit, providing a first reference current to the reference resistor and providing a second reference current to the drain-source path of the field-effect transistor, wherein said first and second reference currents function to provide a differential voltage between a first voltage drop caused by the first reference current at the reference resistor and a second voltage drop caused by the second reference current at the drain-source path of the field-effect transistor.

5. The electronic circuit according to claim 4, wherein the electronic circuit is a digital-to-analog converter circuit.

6. The circuit arrangement according to claim 1, wherein the first reference current and the second reference current are based on the differential voltage.

7. The electronic circuit according to claim 4, wherein the first reference current and the second reference current are based on the differential voltage.

8. A circuit arrangement comprising:
- a current mirror configured to generate a first reference current and a second reference current based on a balancing current;
- a reference resistor connectable to the current mirror, the first reference current configured to provide a first voltage drop across the reference resistor;
- a field-effect transistor connectable to the current mirror, the second reference current configured to provide a second voltage drop across a drain-source path of the field-effect transistor;
- a controllable current source connectable to the current mirror, the controllable current source being configured to provide the balancing current; and
- a differential amplifier having a first input connectable to the reference resistor and a second input connectable to the field-effect transistor and having an output connectable to the controllable current source and the field-effect transistor.

9. The circuit arrangement according to claim 8, wherein the controllable current source is a field-effect transistor.

10. The circuit arrangement according to claim 8, wherein the output of the differential amplifier is directly connected to the controllable current source and the field-effect transistor.

11. The circuit arrangement according to claim 8, wherein the output of the differential amplifier is directly connected to an input of the controllable current source and to a gate of the field-effect transistor.

* * * * *